(12) United States Patent
Ariyama (10) Patent No.: US 8,093,889 B2
(45) Date of Patent: Jan. 10, 2012

(54) SENSOR CIRCUIT

(75) Inventor: Minoru Ariyama, Chiba (JP)

(73) Assignee: Seiko Instruments Inc. (JP)

( * ) Notice: Subject to any disclaimer, the term of this patent is extended or adjusted under 35 U.S.C. 154(b) by 183 days.

(21) Appl. No.: 12/614,939

(22) Filed: Nov. 9, 2009

(65) Prior Publication Data

US 2010/0117715 A1 May 13, 2010

(30) Foreign Application Priority Data

Nov. 13, 2008 (JP) ................................. 2008-291394

(51) Int. Cl.
*G01R 33/00* (2006.01)
*G01R 15/20* (2006.01)
*G01R 15/18* (2006.01)

(52) U.S. Cl. ..................... 324/225; 324/117 H; 324/127

(58) Field of Classification Search .............. 324/117 H, 324/117 R, 250–252, 225, 720, 721, 706; 327/68, 512, 513; 702/58–62
See application file for complete search history.

(56) References Cited

U.S. PATENT DOCUMENTS 4,020,487 A * 4/1977 Winter ........................... 341/170
2010/0117637 A1* 5/2010 Ariyama ....................... 324/225

FOREIGN PATENT DOCUMENTS

JP 10-253728 A 9/1998

* cited by examiner

*Primary Examiner* — Huy Q Phan
*Assistant Examiner* — Tung X Nguyen
(74) *Attorney, Agent, or Firm* — Brinks Hofer Gilson & Lione (57) ABSTRACT

Provided is a sensor circuit that is small in circuit scale, but is capable of temperature compensation. A reference voltage circuit (BL1) which compensates a temperature includes only a voltage divider circuit, and hence the sensor circuit is small in circuit scale. The sensor circuit is also capable of temperature compensation because temperature changes of reference voltages (VTH11 and VTH12) and reference voltages (VTH21 and VTH22) match a temperature change of an output signal (OUTA) of an amplifier circuit (AMP1) which is caused by a temperature change of an output signal of a Hall element (HAL1).

5 Claims, 5 Drawing Sheets

⊗ FORWARD DIRECTION
⊙ REVERSE DIRECTION

SENSOR CIRCUIT

RELATED APPLICATIONS

This application claims priority under 35 U.S.C. §119 to Japanese Patent Application No. 2008-291394 filed on Nov. 13, 2008, the entire content of which is hereby incorporated by reference.

BACKGROUND OF THE INVENTION

1. Field of the Invention

The present invention relates to a sensor circuit.

2. Description of the Related Art

Today's electronic devices are mounted with various sensor circuits. For example, a magnetic sensor circuit which detects the magnetism of a magnet is installed in one electronic device. This electronic device has a mechanism for folding a part of its main body. The folding mechanism has a magnet and a magnetic sensor circuit. Opening and closing the folding mechanism causes a change in distance between the magnet and the magnetic sensor circuit, thus changing the magnetic flux density of a magnetic field generated by the magnet, which is applied to the sensor circuit. A magnetic flux density equal to or larger than a given value means that the folding mechanism is open, and a magnetic flux density smaller than the given value means that the folding mechanism is closed.

An output signal of a sensor circuit in general has a temperature coefficient. Some sensor circuits are equipped with a temperature compensation circuit which compensates the temperature in order to cancel out the temperature coefficient.

Figure 7:
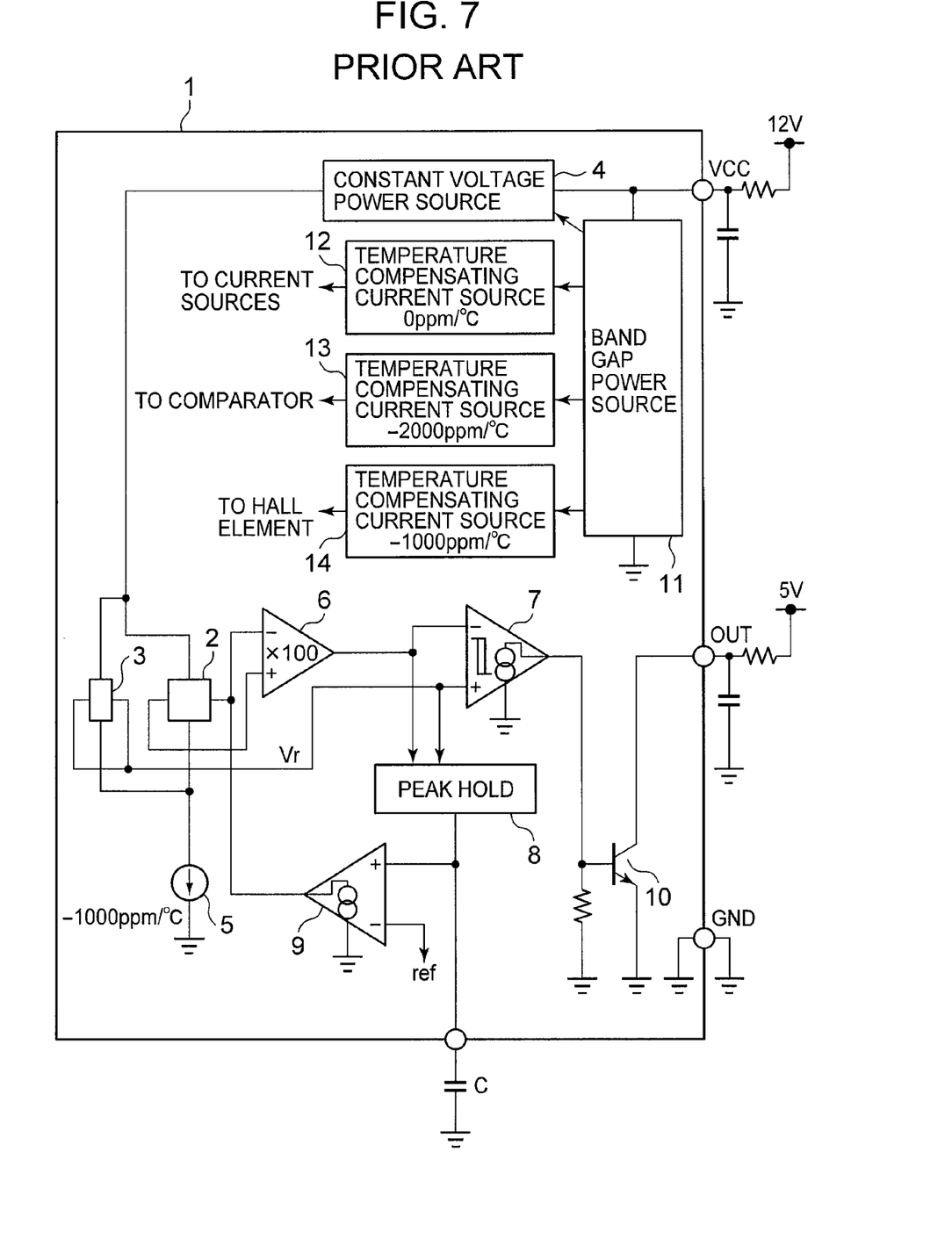
FIG. 7 is a diagram illustrating a temperature compensation circuit installed in a conventional magnetic sensor circuit.

A temperature compensation circuit installed in a conventional magnetic sensor circuit is described. FIG. 7 is a diagram illustrating a temperature compensation circuit installed in a conventional magnetic sensor circuit.

A current source 14 supplies a current that has a temperature coefficient to a current source 5 based on a constant voltage from a band gap reference voltage generating circuit 11. A current from the current source 5 drives sensor elements 2 and 3. The temperature coefficient of the current from the current source 14 cancels out the temperature coefficient of an output signal of the sensor circuit (see JP 10-253728 A, for example).

However, the band gap reference voltage generating circuit 11 and various current sources necessary for temperature compensation increase the circuit scale.

SUMMARY OF THE INVENTION

The present invention has been made in view of the problem described above, and an object of the present invention is therefore to provide a sensor circuit that is small in circuit scale, but is capable of temperature compensation.

In order to solve the problem described above, the present invention provides a sensor circuit including: a sensor element which outputs an output signal that has a first temperature coefficient based on an external factor; an amplifier circuit which amplifies the output signal of the sensor element, and which outputs an output signal that has a second temperature coefficient based on the first temperature coefficient and contains noise; a reference voltage circuit which includes a voltage divider circuit, a first temperature compensating resistor, and a second temperature compensating resistor, and which outputs a reference voltage, the voltage divider circuit including a plurality of resistors that have the same temperature coefficient, the first temperature compensating resistor having a temperature coefficient different from the temperature coefficient of the plurality of resistors, the second temperature compensating resistor having a temperature coefficient different from the temperature coefficient of the plurality of resistors and having a resistance value based on temperature characteristics of the noise, the reference voltage having a third temperature coefficient, which is substantially equal to the second temperature coefficient; and a comparator circuit which compares the output signal of the amplifier circuit and the reference voltage of the reference voltage circuit to output one of a High signal and a Low signal when the output signal of the amplifier circuit is equal to or larger than the reference voltage of the reference voltage circuit, and to output another one of the Low signal and the High signal when the output signal of the amplifier circuit is smaller than the reference voltage of the reference voltage circuit.

In the present invention where the reference voltage circuit which compensates the temperature includes only the voltage divider circuit, the sensor circuit is small in circuit scale.

The sensor circuit of the present invention is also capable of temperature compensation because a temperature change of the reference voltage matches a temperature change of the output signal of the amplifier circuit which is caused by a temperature change of the output signal of the sensor element.

DETAILED DESCRIPTION OF THE PREFERRED EMBODIMENTS

An embodiment of the present invention is described below with reference to the drawings.

Figure 1:
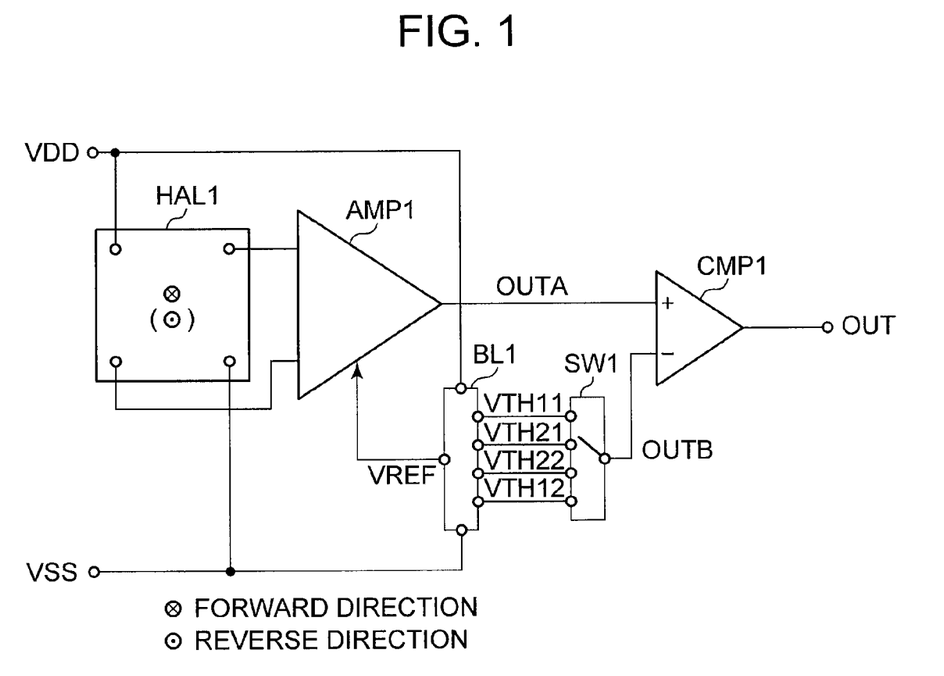
FIG. 1 is a diagram illustrating a sensor circuit.

The structure of a sensor circuit is described first. FIG. 1 is a diagram illustrating a sensor circuit.

The sensor circuit includes a Hall element HAL1, an amplifier circuit AMP1, a comparator circuit CMP1, a reference voltage circuit BL1, and a switch circuit SW1.

The Hall element HAL1 has a first terminal, which is connected to a supply terminal, a second terminal, which is connected to a ground terminal, a third terminal, which is connected to a first input terminal of the amplifier circuit AMP1, and a fourth terminal, which is connected to a second input terminal of the amplifier circuit AMP1. The amplifier circuit AMP1 has a reference voltage terminal, which is connected to a reference voltage terminal of the reference voltage circuit BL1, and an output terminal, which is connected to a non-inverting input terminal of the comparator circuit CMP1. An inverting input terminal of the comparator circuit CMP1 is connected to an output terminal of the switch circuit SW1. The reference voltage circuit BL1 has a first output terminal, which is connected to a first input terminal of the switch circuit SW1, a second output terminal, which is connected to a second input terminal of the switch circuit SW1, a third output terminal, which is connected to a third input terminal of the switch circuit SW1, and a fourth output terminal, which is connected to a fourth input terminal of the switch circuit SW1.

The operation of the sensor circuit is described next.

A magnetic field is applied to the Hall element HAL1 Based on the magnetic flux density and direction of the magnetic field and a supply voltage VDD of the supply terminal, the Hall element HAL1 outputs an output signal that has a temperature coefficient (Hall voltage) to the amplifier circuit AMP1. The output signal of the Hall element HAL1 is amplified by the amplifier circuit AMP1. The amplifier circuit AMP1 outputs an output signal OUTA, which has a temperature coefficient based on the temperature coefficient of the output signal of the Hall element HAL1, to the non-inverting input terminal of the comparator circuit CMP1. The reference voltage circuit BL1 outputs reference voltages VTH11 and VTH12 and reference voltages VTH21 and VTH22 to the switch circuit SW1. The switch circuit SW1 chooses one of these reference voltages that has a temperature coefficient substantially equal to that of the output signal OUTA, and inputs the chosen reference voltage to the inverting input terminal of the comparator circuit CMP1 as a reference voltage OUTB. The comparator circuit CMP1 compares the output signal OUTA and the reference voltage OUTB, and outputs a High signal as an output signal OUT when the output signal OUTA is equal to or larger than the reference voltage OUTB, and outputs a Low signal as the output signal OUT when the output signal OUTA is smaller than the reference voltage OUTB.

When a magnetic field whose magnetic flux density is equal to or larger than the reference voltage VTH11, the reference voltage VTH12, the reference voltage VTH21, or the reference voltage VTH22 is applied to the Hall element HAL1, in other words, when the magnetic flux density of a magnetic field applied to the Hall element HAL1 is higher than a magnetic detection point, the sensor circuit detects the magnetic field and outputs a High signal (magnetic detection operation). When a magnetic field whose magnetic flux density is equal to or larger than the reference voltage VTH11, the reference voltage VTH12, the reference voltage VTH21, or the reference voltage VTH22 is no longer applied to the Hall element HAL1, in other words, when the magnetic flux density of a magnetic field applied to the Hall element HAL1 is lower than a magnetic detection cancellation point, the sensor circuit cancels magnetic detection and outputs a Low signal (magnetic detection cancellation operation). The magnetic detection point is determined based on the reference voltage VTH11 or the reference voltage VTH12. The magnetic detection cancellation point is determined based on the reference voltage VTH21 or the reference voltage VTH22.

Figure 2:
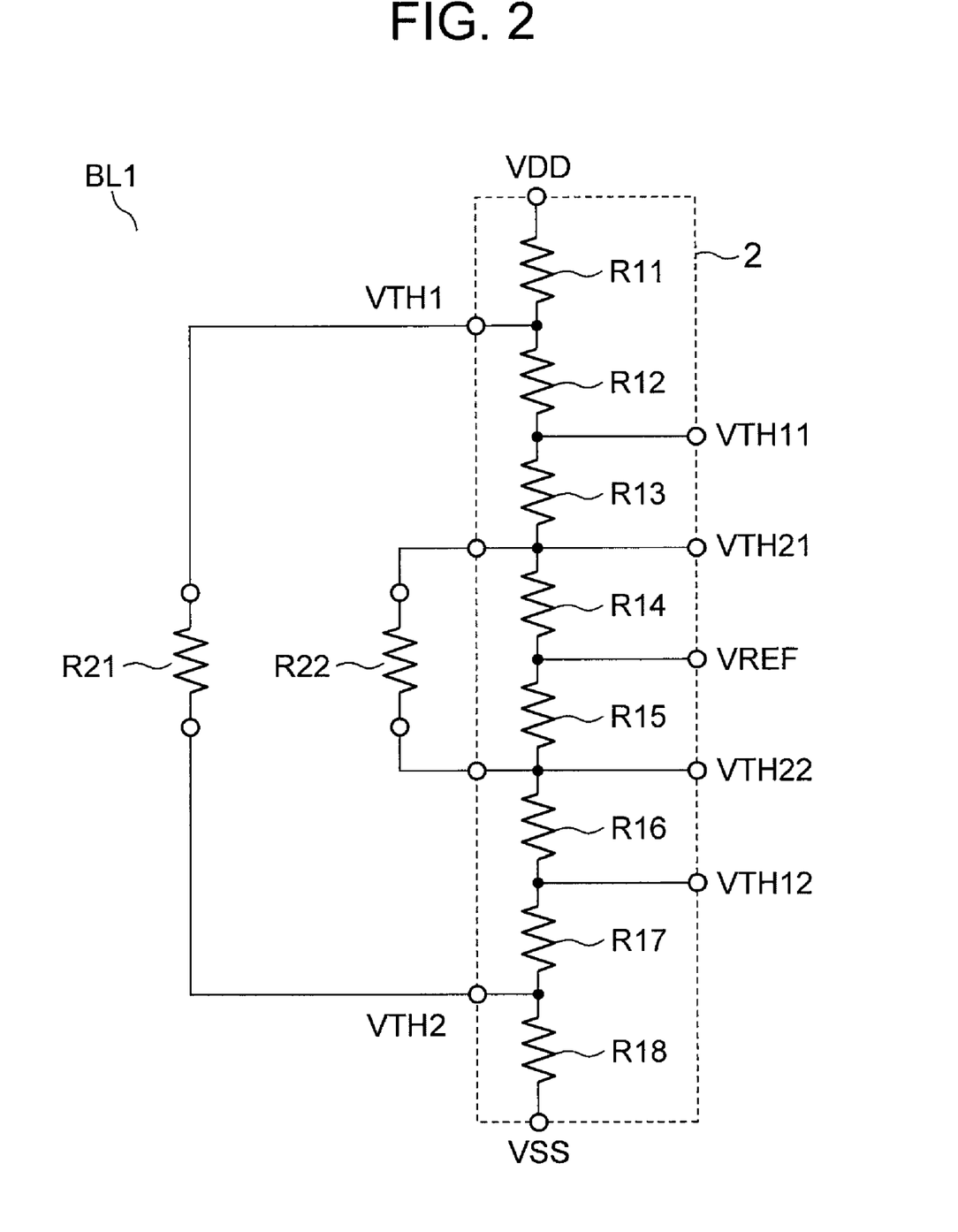
FIG. 2 is a diagram illustrating a reference voltage circuit.
Figure 3:
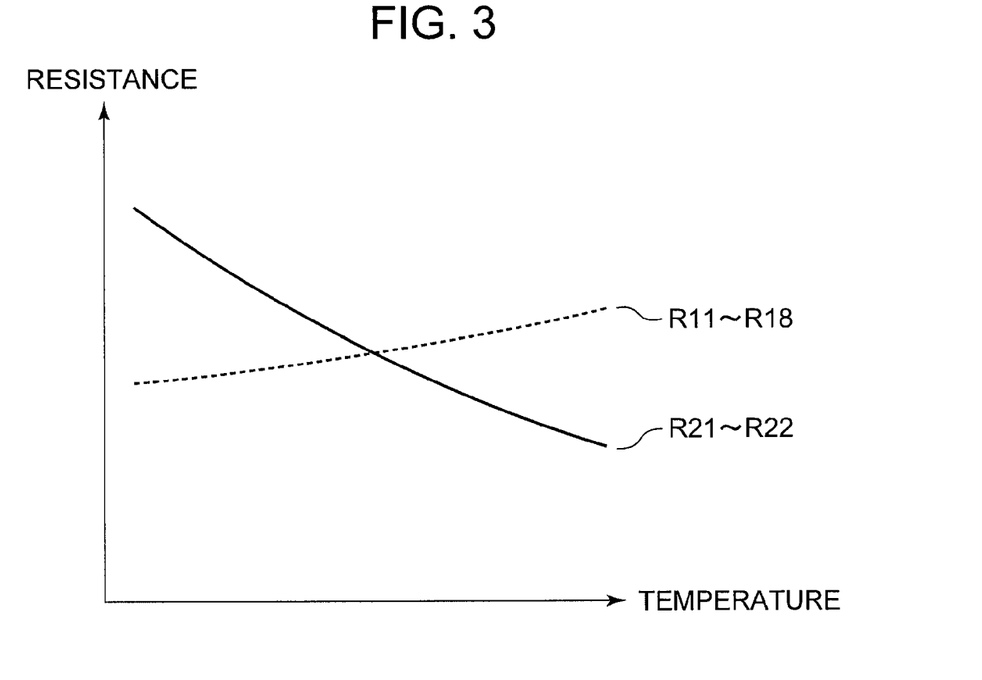
FIG. 3 is a diagram illustrating a change in resistance in relation to a change in temperature.
Figure 4:
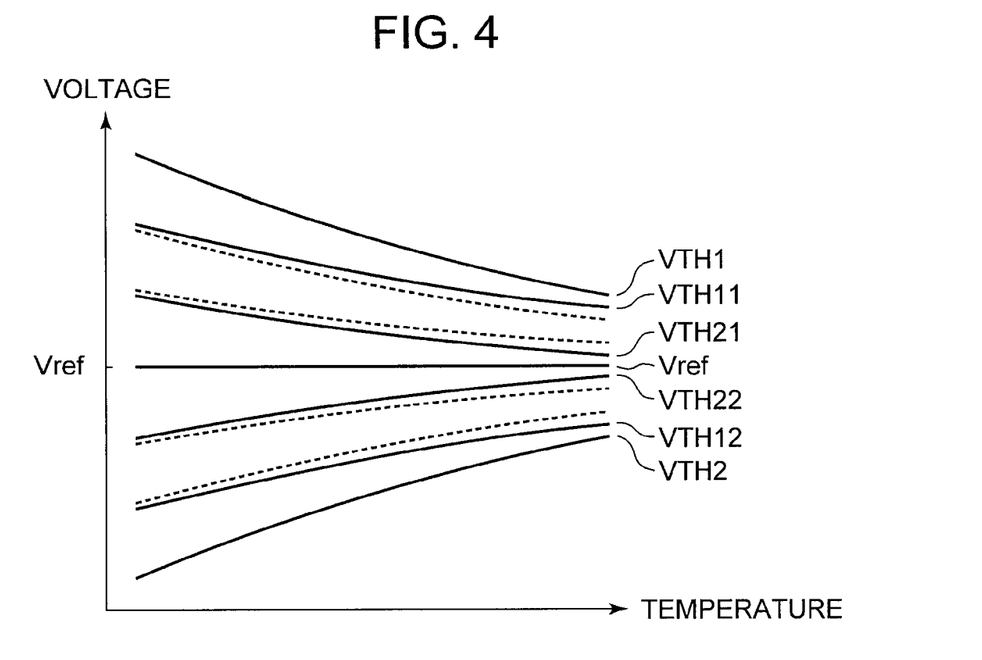
FIG. 4 is a diagram illustrating a change in reference voltage in relation to a change in temperature.

The reference voltage circuit BL1 is described next. FIG. 2 is a diagram illustrating the reference voltage circuit. FIG. 3 is a diagram illustrating a change in resistance in relation to a change in temperature. FIG. 4 is a diagram illustrating a change in reference voltage in relation to a change in temperature.

The reference voltage circuit BL1 includes temperature compensating resistors R21 and R22 and a voltage divider circuit 2. The voltage divider circuit 2 has resistors R11 to R18.

The resistors R11 to R18 are serially connected in order between the supply terminal and the ground terminal. The reference voltage terminal is placed at the connection point between the resistor R14 and the resistor R15. A fifth output terminal is placed at the connection point between the resistor R11 and the resistor R12. The first output terminal is placed at the connection point between the resistor R12 and the resistor R13. The second output terminal is placed at the connection point between the resistor R13 and the resistor R14. The third output terminal is placed at the connection point between the resistor R15 and the resistor R16. The fourth output terminal is placed at the connection point between the resistor R16 and the resistor R17. A sixth output terminal is placed at the connection point between the resistor R17 and the resistor R18. The temperature compensating resistor R21 is placed between the fifth output terminal and the sixth output terminal. The temperature compensating resistor R22 is placed between the second output terminal and the third output terminal.

The reference voltage circuit BL1 not only outputs reference voltages but also compensates the temperature in the sensor circuit.

As illustrated in FIG. 3, the resistors R11 to R18 have the same temperature coefficient and the same resistance value. The resistors R21 and R22 have the same temperature coefficient and the same resistance value. The temperature coefficient of the resistors R11 to R18 is larger than that of the temperature compensating resistors R21 and R22.

The resistance value of the resistors R11 to R18 and the resistance value of the temperature compensating resistors R21 and R22 are given as Ra and Rb, respectively, for the sake of convenience. A resistance value between the fifth output terminal and the sixth output terminal is given as Rj. A resistance value between the second output terminal and the third output terminal is given as Ri. Then the following relations are satisfied:

$$Ri = 2Ra \cdot Rb/(2Ra+Rb) \quad (1)$$

$$Rj = Rb(Ri+4Ra)/(Rb+Ri+4Ra) \quad (2)$$

When a voltage generated at the resistors R11 and R18 is given as Vr11, a voltage at the resistors R12, R13, R16, and R17 is given as Vr13, and a voltage generated at the resistors R14 and R15 is given as Vr14, the following relations are satisfied:

$$Vr11 = VDD \cdot Ra/(2Ra+Rj) \quad (3)$$

$$Vr13 = VDD \cdot Ra \cdot Rj/\{(Ri+4Ra) \cdot (Rj+2Ra)\} \quad (4)$$

$$Vr14 = (1/2) \cdot VDD \cdot Ri \cdot Rj/\{(Ri+4Ra) \cdot (Rj+2Ra)\} \quad (5)$$

A reference voltage VREF is calculated by the following expression:

$$VREF = VDD/2 \quad (6)$$

A reference voltage VTH1 at the connection point between the resistor R11 and the resistor R12 (fifth output terminal) is calculated by the following expression:

$$VTH1 = VDD - Vr11 \quad (7)$$

A reference voltage VTH2 at the connection point between the resistor R17 and the resistor R18 (sixth output terminal) is calculated by the following expression:

$$VTH2 = Vr11 \quad (8)$$

Then, the following relations are satisfied:

$$VTH1 - VREF = VDD/2 - Vr11 \quad (9)$$

$$VTH2 - VREF = -(VDD/2 - Vr11) \quad (10)$$

Accordingly, the reference voltages VTH1 and VTH2 have temperature coefficients axisymmetric with respect to the reference voltage VREF as illustrated in FIG. 4. A rise in temperature makes the reference voltage VTH1 smaller and the reference voltage VTH2 larger.

The reference voltage VTH11, which is a reference voltage at the connection point between the resistor R12 and the resistor R13 (first output terminal), is calculated by the following expression:

$$VTH11 = VREF + (Vr13 + Vr14) \quad (11)$$

The reference voltage VTH12, which is a reference voltage at the connection point between the resistor R16 and the resistor R17 (fourth output terminal), is calculated by the following expression:

$$VTH12 = VREF - (Vr13 + Vr14) \quad (12)$$

Then, the following relations are satisfied:

$$VTH11 - VREF = Vr13 + Vr14 \quad (13)$$

$$VTH12 - VREF = -(Vr13 + Vr14) \quad (14)$$

Accordingly, the reference voltages VTH11 and VTH12 have temperature coefficients axisymmetric with respect to the reference voltage VREF as illustrated in FIG. 4. A rise in temperature makes the reference voltage VTH11 smaller and the reference voltage VTH12 larger.

The reference voltage VTH21, which is a reference voltage at the connection point between the resistor R13 and the resistor R14 (second output terminal), is calculated by the following expression:

$$VTH21 = VREF + Vr14 \quad (15)$$

The reference voltage VTH22, which is a reference voltage at the connection point between the resistor R15 and the resistor R16 (third output terminal), is calculated by the following expression:

$$VTH22 = VREF - Vr14 \quad (16)$$

Then, the following relations are satisfied:

$$VTH21 - VREF = Vr14 \quad (17)$$

$$VTH22 - VREF = -Vr14 \quad (18)$$

Accordingly, the reference voltages VTH21 and VTH22 have temperature coefficients axisymmetric with respect to the reference voltage VREF as illustrated in FIG. 4. A rise in temperature makes the reference voltage VTH21 smaller and the reference voltage VTH22 larger.

Figure 5:
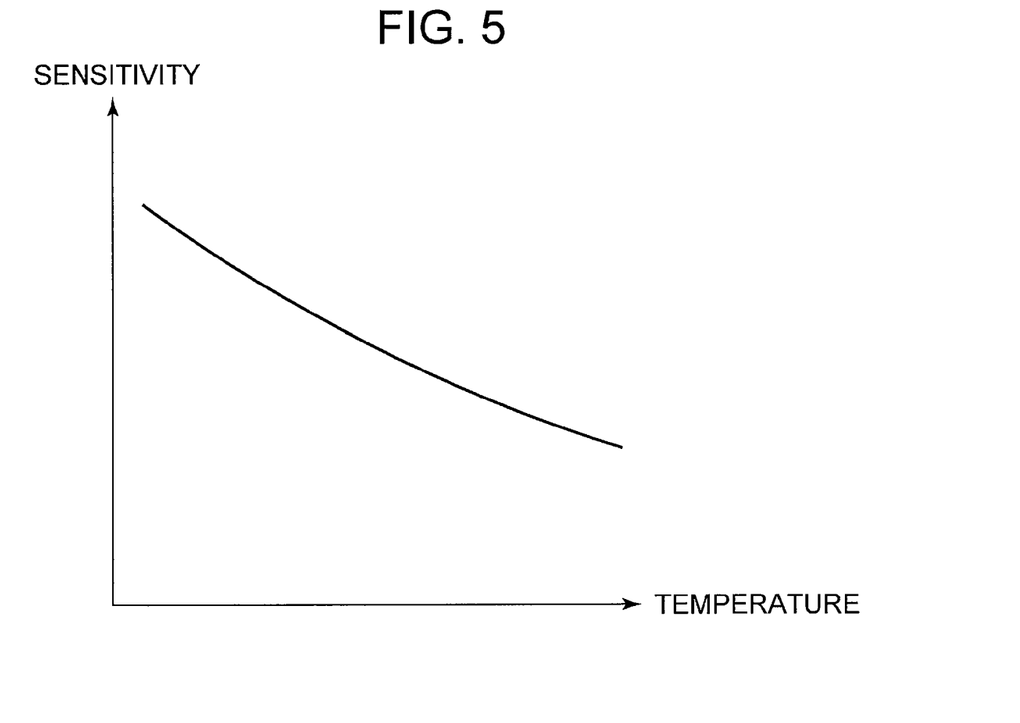
FIG. 5 is a diagram illustrating a change in sensitivity of a Hall element in relation to a change in temperature.

The Hall element HAL1 is described next. FIG. 5 is a diagram illustrating a change in sensitivity of the Hall element in relation to a change in temperature.

The sensitivity of the Hall element HAL1 (the output signal of the Hall element HAL1 which is output when a magnetic field is applied to the Hall element HAL1) has a temperature coefficient as illustrated in FIG. 5. A rise in temperature lowers the sensitivity of the Hall element HAL1.

As the output signal of the Hall element HAL1 has a temperature coefficient, the output signal OUTA of the amplifier circuit AMP1 also has a temperature coefficient. Therefore, if the reference voltage VTH11, the reference voltage VTH12, the reference voltage VTH21, or the reference voltage VTH22 does not have a temperature coefficient, the magnetic detection point and the magnetic detection cancellation point have apparent temperature coefficients. In other words, the temperature coefficients of the magnetic detection point and the magnetic detection cancellation point are seemingly dependent on the temperature coefficient of the sensitivity of the Hall element HAL1.

However, in the present invention, the temperature coefficients of the reference voltages VTH11 and VTH12 and the reference voltages VTH21 and VTH22 are matched to the temperature coefficient of the output signal OUTA of the amplifier circuit AMP1, which is based on the temperature coefficient of the sensitivity of the Hall element HALL by adjusting the temperature coefficients and resistance values of the resistors R11 to R18 and the temperature compensating resistors R21 and R22. Therefore, when the output signal of the Hall element HAL1 undergoes a temperature change, causing a temperature change of the output signal OUTA of the amplifier circuit AMP1, the temperature changes that much for the reference voltages VTH11 and VTH12 and the reference voltages VTH21 and VTH22, with the result that the magnetic detection point and the magnetic detection cancellation point no longer have apparent temperature coefficients. In short, the magnetic detection point and the magnetic detection cancellation point can be set to any value by adjusting the temperature coefficients and resistance values of the resistors R11 to R18 and the temperature compensating resistors R21 and R22.

The switch circuit SW1 is described next.

The switch circuit SW1 has the first to fourth input terminals and one output terminal.

The positive/negative polarity of the output signal of the Hall element HAL1 is inverted depending on the direction of a magnetic field applied to the Hall element HAL1, and the positive/negative polarity of the output signal OUTA of the amplifier circuit AMP1, too, is inverted accordingly. Based on the direction of the magnetic field, the switch circuit SW1 chooses one of the reference voltages VTH11 and VTH12 and the reference voltages VTH21 and VTH22, and outputs the chosen voltage as the reference voltage OUTB. The output signal OUTA which reflects the positive/negative polarity of the amplifier circuit AMP1 has temperature coefficients axisymmetric with respect to the reference voltage VREF. The reference voltages VTH11 and VTH12 have temperature coefficients axisymmetric with respect to the reference voltage VREF and the reference voltages VTH21 and VTH22 have temperature coefficients axisymmetric with respect to the reference voltage VREF. Accordingly, when a magnetic field applied to the Hall element HAL1 has a forward direction and the polarity of the output signal OUTA of the amplifier circuit AMP1 is positive, for example, the switch circuit SW1 outputs the reference voltage VTH11 or the reference voltage VTH21 as the reference voltage OUTB. When the magnetic field has a reverse direction and the polarity of the output signal OUTA is negative, the switch circuit SW1 outputs the reference voltage VTH12 or the reference voltage VTH22 as the reference voltage OUTB.

Figure 6:
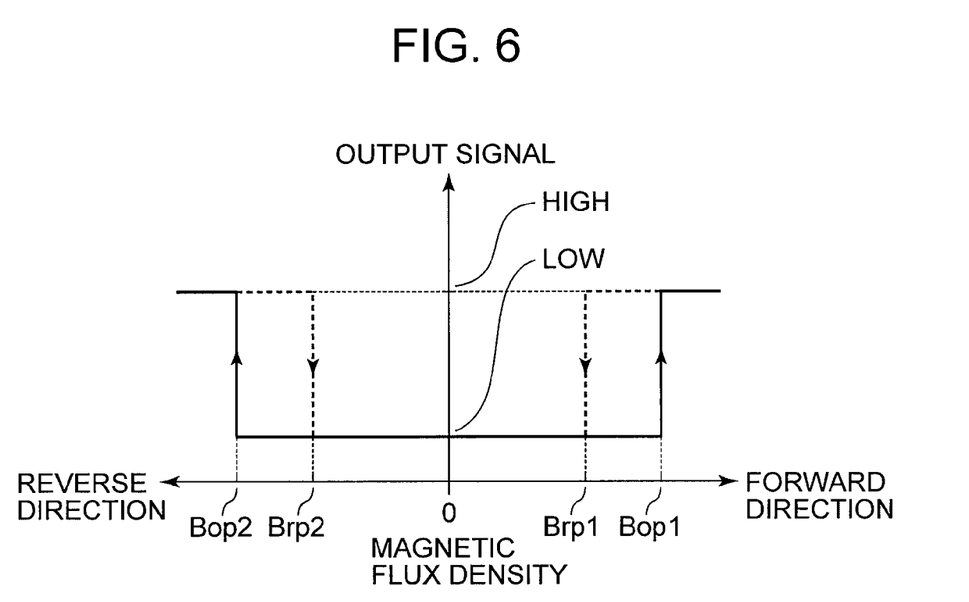
FIG. 6 is a diagram illustrating an output signal of the sensor circuit.

With a plurality of reference voltages and a plurality of magnetic detection points and magnetic detection cancellation points, the sensor circuit has a high degree of freedom. For instance, as illustrated in FIG. 6, a selection between two options, a magnetic detection point Bop1 and a magnetic detection point Bop2, may be made based on the reference voltage VTH11 or the reference voltage VTH12. Further, a selection between a magnetic detection cancellation point Brp1 and a magnetic detection cancellation point Brp2 may be made based on the reference voltage VTH21 or the reference voltage VTH22. In this case, when the direction of a magnetic field applied to the Hall element HAL1 is forward and the magnetic flux density of the magnetic field is higher than the magnetic detection point Bop1, the sensor circuit outputs a High signal. When the direction of the magnetic field is reverse and the magnetic flux density of the magnetic field is higher than the magnetic detection point Bop2, the sensor circuit outputs a High signal. When the direction of the magnetic field is forward and the magnetic flux density of the magnetic field is lower than the magnetic detection cancellation point Brp1, the sensor circuit outputs a Low signal. When the direction of the magnetic field is reverse and the magnetic flux density of the magnetic field is lower than the magnetic detection cancellation point Brp2, the sensor circuit outputs a Low signal. In short, there are hysteresis characteristics between magnetic flux densities at a magnetic detection point and a magnetic detection cancellation point. The sensor circuit includes, though not illustrated in the drawings, a signal processing circuit downstream of the comparator circuit CMP1, and the signal processing circuit stores a past output signal of the sensor circuit in order to implement hysteresis characteristics. When the past output signal of the sensor circuit is high and the current output signal of the sensor circuit is low, the sensor circuit operates at the magnetic detection cancellation point. When the past output signal of the sensor circuit is low and the current output signal of the sensor circuit is high, the sensor circuit operates at the magnetic detection point.

In FIG. 4, solid lines represent how the reference voltages VTH11 and VTH12 and reference voltages VTH21 and VTH22 according to the present invention behave when the sensor circuit has the temperature compensating resistor R22. The solid lines show that the hysteresis width hardly changes when the temperature is high. Dotted lines in FIG. 4 represent how the reference voltages VTH11 and VTH12 and the reference voltages VTH21 and VTH22 behave when the sensor circuit does not have the temperature compensating resistor R22. The dotted lines show that the hysteresis width narrows as the temperature rises. By circuit design, the resistance value of the temperature compensating resistor R22 is suited to the temperature characteristics of noise of the output signal of the amplifier circuit AWL and the reference voltages VTH11 and VTH12 and the reference voltages VTH21 and VTH22 are thus determined. Specifically, the reference voltages VTH11 and VTH12 and the reference voltages VTH21 and VTH22 are determined such that the hysteresis width of the solid lines hardly changes when a rise in temperature causes substantially no change in temperature characteristics of the noise of the output signal of the amplifier circuit AMP1.

This way, the reference voltage circuit BL1 which performs temperature compensation has only the temperature compensating resistors R21 and R22 and the voltage divider circuit 2. The sensor circuit is thus reduced in circuit scale.

The sensor circuit is also capable of temperature compensation because, when a temperature change of the output signal of the Hall element HAL1 causes a temperature change of the output signal OUTA of the amplifier circuit AWL the temperature changes that much for the reference voltages VTH11 and VTH12 and the reference voltages VTH21 and VTH22 as well, with the result that the magnetic detection point and the magnetic detection cancellation point no longer have apparent temperature coefficients.

The positive/negative polarity of the output signal of the Hall element HAL1 is inverted depending on the direction of a magnetic field applied to the Hall element HAL1, which inverts the positive/negative polarity of the output signal OUTA of the amplifier circuit AMP1. Even in such a case, a polarity inversion of the output signal OUTA does not prevent the output signal OUTA which reflects the positive/negative polarity of the amplifier circuit AMP1 from having temperature coefficients axisymmetric with respect to the reference voltage VREF, does not prevent the reference voltages VTH11 and VTH12 from having temperature coefficients axisymmetric with respect to the reference voltage VREF, and does not prevent the reference voltages VTH21 and VTH22 from having temperature coefficients axisymmetric with respect to the reference voltage VREF. Therefore, the magnetic detection point and the magnetic detection cancellation point do not have apparent temperature coefficients and the sensor circuit thus accomplishes temperature compensation.

The reference voltages VTH11 and VTH12 and the reference voltages VTH21 and VTH22 are generated by resistors connected between the supply terminal and the ground terminal. Consequently, the reference voltages VTH11 and VTH12 and the reference voltages VTH21 and VTH22 are in proportion to the supply voltage VDD, and the output signal of the Hall element HAL1, too, is in proportion to the supply voltage VDD. The magnetic detection point and the magnetic detection cancellation point are therefore not dependent on the supply voltage VDD.

By circuit design, the resistance value of the temperature compensating resistor R22 is suited to the temperature characteristics of noise of the output signal of the amplifier circuit AMP1, and the reference voltages VTH11 and VTH12 and the reference voltages VTH21 and VTH22 are thus determined. The sensor circuit is therefore capable of more accurate temperature compensation.

The description given above uses, as the sensor element of the sensor circuit, the Hall element HAL1 which outputs an output signal having a temperature coefficient based on the magnetic flux density and direction of an applied magnetic field. Instead, a sensor element that outputs an output signal having a temperature coefficient based on some external factor may be employed.

The resistors R11 to R18, which have the same temperature coefficient and the same resistance value for the sake of convenience, may have a temperature coefficient and a resistance value that are adjusted based on desired values of the reference voltages VTH11 and VTH12 and the reference voltages VTH21 and VTH22. The same applies to the temperature compensating resistors R21 and R22.

Although not illustrated in the drawings, the reference voltage circuit BL1, which is connected directly between the supply terminal and the ground terminal, may be connected via a switch circuit. The switch circuit is switched off when the reference voltage circuit BL1 is not needed, with the result that power supply to the reference voltage circuit BL1 is cut off, reducing the current consumption of the reference voltage circuit BL1 to substantially zero.

In FIG. 6, the sensor circuit outputs a High signal when the magnetic flux density of a magnetic field applied to the Hall element HAL1 is higher than the magnetic detection point. Alternatively, though not illustrated in the drawings, the sensor circuit may output a Low signal. The same applies to the magnetic detection cancellation point.

What is claimed is:

1. A sensor circuit comprising:
a sensor element which outputs an output signal that has a first temperature coefficient based on an external factor;
an amplifier circuit which amplifies the output signal of the sensor element, and which outputs an output signal that has a second temperature coefficient based on the first temperature coefficient and contains noise;
a reference voltage circuit which includes a voltage divider circuit, a first temperature compensating resistor, and a second temperature compensating resistor, and which outputs a reference voltage, the voltage divider circuit including a plurality of resistors that have the same temperature coefficient, the first temperature compensating resistor having a temperature coefficient different from the temperature coefficient of the plurality of resistors, the second temperature compensating resistor having a temperature coefficient different from the temperature coefficient of the plurality of resistors and having a resistance value based on temperature characteristics of the noise, the reference voltage having a third temperature coefficient, which is substantially equal to the second temperature coefficient; and a comparator circuit which compares the output signal of the amplifier circuit and the reference voltage of the reference voltage circuit to output one of a High signal and a Low signal when the output signal of the amplifier circuit is equal to or larger than the reference voltage of the reference voltage circuit, and to output another one of the Low signal and the High signal when the output signal of the amplifier circuit is smaller than the reference voltage of the reference voltage circuit.

2. A sensor circuit according to claim 1, wherein the sensor element includes a Hall element that outputs an output signal based on a magnetic flux density and direction of an applied magnetic field.

3. A sensor circuit according to claim 1, further comprising a first switch circuit which cuts off power supply to the reference voltage circuit.

4. A sensor circuit according to claim 1, wherein the sensor element outputs an output signal based on the external factor and a supply voltage.

5. A sensor circuit according to claim 1, wherein the reference voltage circuit includes:

a first resistor, a second resistor, a third resistor, a fourth resistor, a fifth resistor, a sixth resistor, a seventh resistor, and an eighth resistor which are serially connected in the stated order between a supply terminal and a ground terminal;

a reference voltage terminal which is placed at a connection point between the fourth resistor and the fifth resistor;

a fifth output terminal which is placed at a connection point between the first resistor and the second resistor;

a first output terminal which is placed at a connection point between the second resistor and the third resistor;

a second output terminal which is placed at a connection point between the third resistor and the fourth resistor;

a third output terminal which is placed at a connection point between the fifth resistor and the sixth resistor;

a fourth output terminal which is placed at a connection point between the sixth resistor and the seventh resistor;

a sixth output terminal which is placed at a connection point between the seventh resistor and the eighth resistor;

the first temperature compensating resistor which is placed between the fifth output terminal and the sixth output terminal; and the second temperature compensating resistor which is placed between the second output terminal and the third output terminal.

* * * * *